(12) United States Patent
Lee

(10) Patent No.: US 6,660,562 B2
(45) Date of Patent: Dec. 9, 2003

(54) METHOD AND APPARATUS FOR A LEAD-FRAME AIR-CAVITY PACKAGE

(75) Inventor: David Lee, Palo Alto, CA (US)

(73) Assignee: Azimuth Industrial Co., Inc., Hayward, CA (US)

( * ) Notice: Subject to any disclaimer, the term of this patent is extended or adjusted under 35 U.S.C. 154(b) by 0 days.

(21) Appl. No.: 09/998,454

(22) Filed: Dec. 3, 2001

(65) Prior Publication Data

US 2003/0102540 A1 Jun. 5, 2003

(51) Int. Cl.⁷ .............................................. H01L 21/60
(52) U.S. Cl. ..................................................... 438/112
(58) Field of Search ................ 438/112–114, FOR 377; 206/225; 257/710, 711, 23.127, 23.128

(56) References Cited

U.S. PATENT DOCUMENTS

| | | | |
|---|---|---|---|
| 4,778,326 A | * 10/1988 | Althouse et al. ............ 414/800 |
| 5,144,709 A | * 9/1992 | Rooney ........................ 72/335 |
| 5,612,513 A | * 3/1997 | Tuttle et al. ................. 174/260 |
| 5,776,798 A | * 7/1998 | Quan et al. .................. 438/112 |
| 5,801,074 A | * 9/1998 | Kim et al. .................... 438/125 |
| 5,869,353 A | * 2/1999 | Levy et al. .................. 438/109 |
| 5,923,958 A | * 7/1999 | Chou .......................... 438/118 |
| 6,004,833 A | * 12/1999 | Kovats et al. ............... 438/107 |
| 6,222,738 B1 | 4/2001 | Maeno et al. |
| 6,242,284 B1 | 6/2001 | Kang et al. |
| 6,284,569 B1 | * 9/2001 | Sheppard et al. ........... 438/110 |
| 6,384,472 B1 | * 5/2002 | Huang ......................... 257/680 |
| 6,428,650 B1 | * 8/2002 | Chung ......................... 156/250 |
| 6,470,594 B1 | * 10/2002 | Boroson et al. ............... 34/335 |
| 6,474,477 B1 | * 11/2002 | Chang ......................... 206/725 |
| 2001/0001740 A1 | * 5/2001 | Miyawaki ................... 438/700 |
| 2001/0049159 A1 | * 12/2001 | Hsu et al. ................... 438/112 |
| 2002/0014687 A1 | * 2/2002 | Gotoh et al. ................ 257/678 |

FOREIGN PATENT DOCUMENTS

| | | | | |
|---|---|---|---|---|
| JP | 59096749 A | * 6/1984 | ........... H01L/23/02 |
| JP | 63127556 A | * 5/1988 | ........... H01L/23/02 |

\* cited by examiner

Primary Examiner—George Fourson
Assistant Examiner—Suk-San Foong
(74) Attorney, Agent, or Firm—Moser, Patterson & Sheridan LLP

(57) ABSTRACT

Embodiments provide a method, article of manufacture, and apparatus for providing a component package for components such as integrated circuits. In one embodiment, a carrier includes a plurality of sidewalls formed thereon to form a component package assembly. In one aspect, a cover is bonded to the component package assembly to form a plurality of separable individual component packages having a cavity therein, where each individual component package encapsulates at least one component disposed on the carrier. The component package assembly is then separated into individually packaged devices.

12 Claims, 4 Drawing Sheets

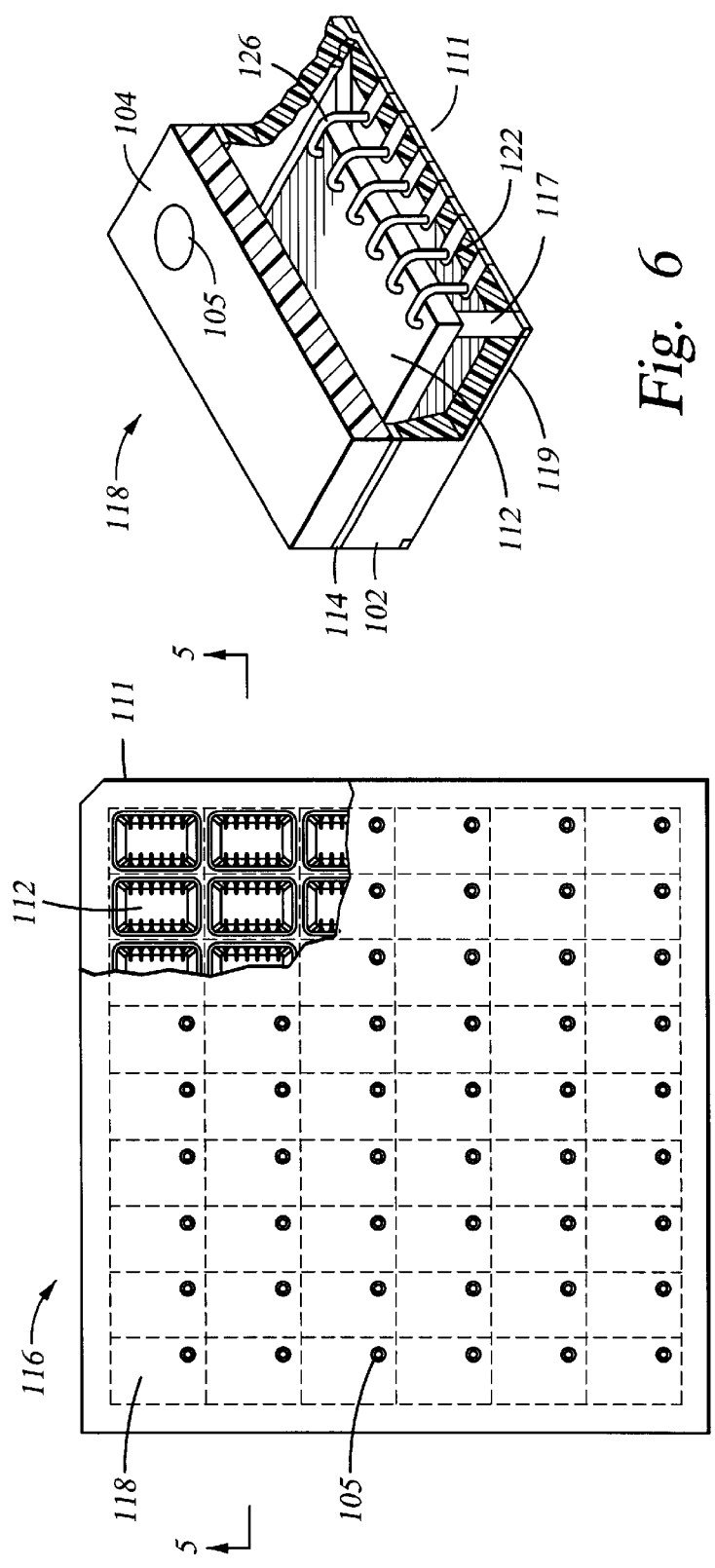
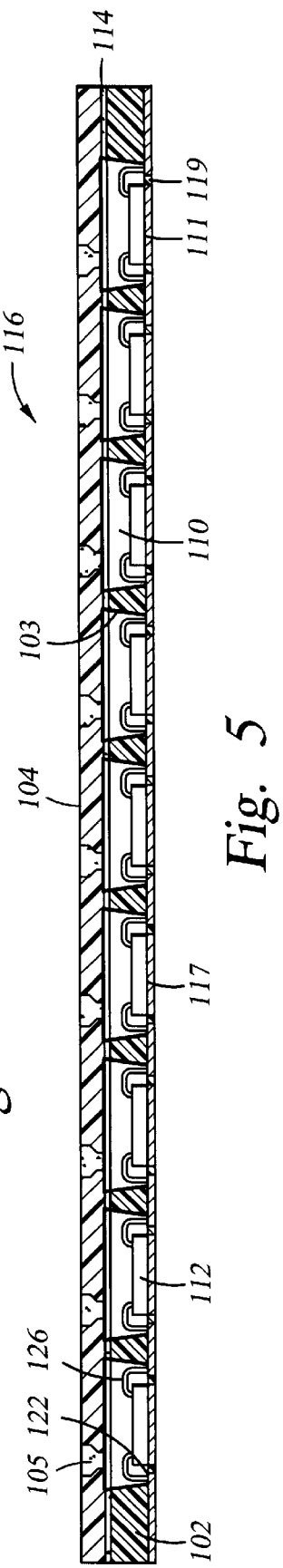
Fig. 4
Fig. 6
Fig. 5

METHOD AND APPARATUS FOR A LEAD-FRAME AIR-CAVITY PACKAGE

CROSS-REFERENCE TO A RELATED APPLICATION

U.S. patent application entitled "Method and Apparatus for An Air-Cavity Package', Ser. No. 09/997,937 filed on Dec. 3, 2001, filed in the name of David Lee is hereby incorporated herein by reference in its entirety.

BACKGROUND OF THE INVENTION

1. Field of the Invention

Embodiments of the invention generally relate to integrated circuit packaging structures.

2. Background of the Related Art

Microelectronic devices typically include one or more die (i.e., micro integrated circuits formed on a single substrate) having a multitude of die bond pads, a chip body, and an interconnection scheme to connect the pads on the die to a supporting substrate. Generally, the supporting substrate is formed into a package around the die to provide physical protection from contaminates. The combination of these is generally referred to as a "chip package". According to conventional packaging methodologies, the number of interconnects for common integrated circuit (IC) packages such as a dual-inline package (DIP), single-inline package (SIP), and others, is limited to the perimeter of the package. Generally, a ball grid array (BGA) package style is used to facilitate an increased connection density. The BGA package provides interconnections from the package bottom or top surface, thus increasing the number of potential interconnection points.

Generally, the ICs increase in speed and performance is directly coupled to an increased device operating frequency. Unfortunately, the increase in device frequency often in the giga-hertz range increases the device sensitivity to parasitic capacitance and inductance. The device packaging, die, and internal die interconnections provide for potential frequency issues. For example, to decrease the height and cost of packaging, device packages are often molded simultaneously to a plurality of individual IC circuits on one substrate. Subsequently, the individual circuits are then cut away from the single substrate using, for example, a high-speed saw to form individual ICs. Unfortunately, as device frequencies increase the type of packaging material used to protect the circuits from external damage and contamination decreases the overall IC performance. To accommodate the higher IC performance, IC manufacturers often use individual ceramic covers having a lower dielectric constant in lieu of the molded package. Unfortunately, to add individual covers is expensive relative to the molded packaging and therefore is often avoided, thereby sacrificing IC performance in devices such as cellular phones. Further, while the individual covers often provide increased device performance, the process of applying the covers often damages the ICs they are designed to protect, thereby decreasing IC throughput and increasing IC cost.

Therefore, what is a needed is a method and apparatus to provide an efficient and a cost effective package for integrated circuits.

SUMMARY OF THE INVENTION

Embodiments of the invention provide a method, article of manufacture, and apparatus for providing component packages for components such as integrated circuits. In one embodiment, the invention provides a method of packaging at least one component, comprising forming a component package assembly including a plurality of component packages on a carrier where each of the plurality of component packages includes a cavity to receive the at least one component therein, and then separating the component packages into a plurality of individually packaged components.

In another embodiment, the invention provides a method of packaging at least one component, comprising forming a body including a plurality of separable component packages on a carrier, and forming a cavity within each of the component packages to enclose the at least one component disposed on the carrier therein.

In another embodiment, the invention provides an apparatus for enclosing at least one component, comprising a component package assembly including a plurality of separable sidewalls formed on a carrier wherein the separable sidewalls and carrier define a plurality of separable component packages adapted to enclose the at least one component therein.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 4 is a top view partially in cross-section of one embodiment of a component package cover assembled to a plurality of component packages forming a plurality of attached component packages.

FIG. 5 is a cross sectional view of one embodiment of a component package cover assembled to the plurality of component packages of FIG. 4.

FIG. 6 is a perspective view, partially in cross-section, of one embodiment of an individual component package detached from the plurality of component packages of FIG. 4.

DETAILED DESCRIPTION OF THE PREFERRED EMBODIMENTS

Embodiments of the invention provide a method, article of manufacture, and apparatus for providing integrated device air-packages. As used herein "package" includes any device package having air as the dielectric regardless of package material. Furthermore, as used herein "component" refers to any device or component such as an integrated circuit device having integrated electrical circuits including a plurality of dies integrated together within a device package and/or components such as resistors, capacitors, and inductors.

Figure 1:
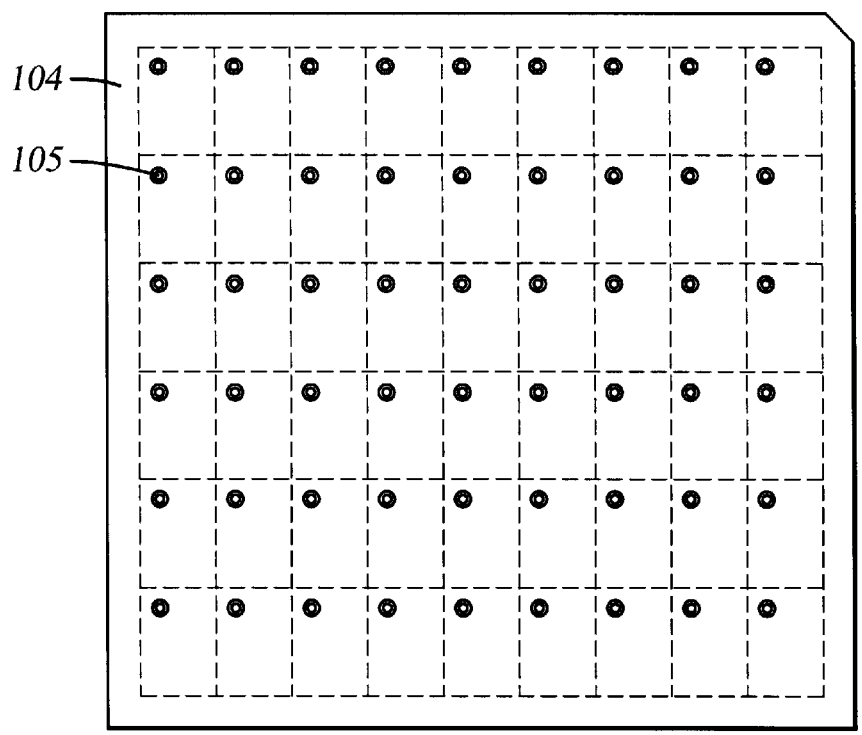
FIG. 1 is a top view of one embodiment of a component package cover.
Figure 2:
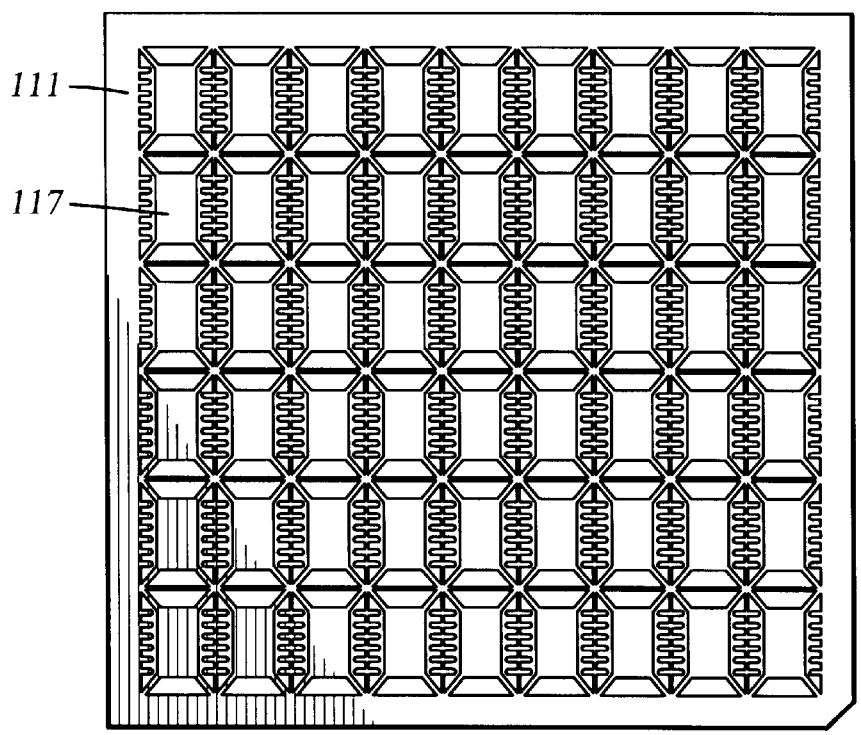
FIG. 2 is a bottom view of one embodiment of a carrier.
Figure 3:
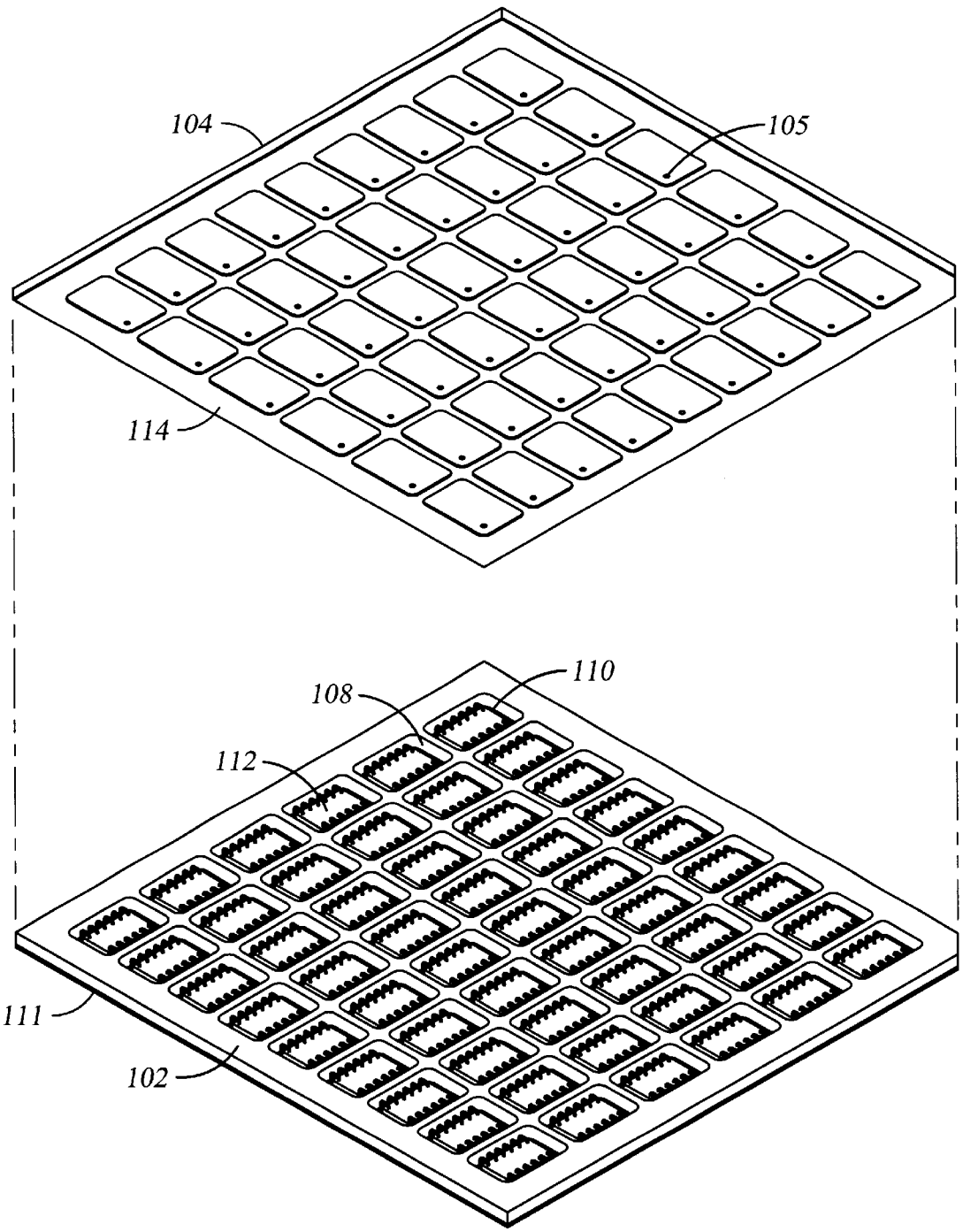
FIG. 3 is a perspective view of one embodiment of a component package cover and a plurality of component packages having components therein mounted on a carrier in position for assembly.

FIG. 1 is a top view of a component package cover 104. The component package cover 104 includes a plurality of vent holes 105 to allow for the escape of water and other contaminates that may off-gas during assembly. The component package cover 104 is adapted to provide a top (e.g., lid) for the component package assembly 116 of FIG. 4 described below. FIG. 2 is a top view of one embodiment of a lead-frame type carrier 111 to mount components such as integrated circuits (i.e. ICs), capacitors, resistors, inductors, and the like, thereon. The carrier 111 may be formed of any conventional lead-frame material such as metal adapted to support one or more components thereon. In one aspect, the lead-frame carrier 111 is adapted to support the one or more components and provide a plurality of electrical interconnections between the one or more components and external electrical circuits (not shown). FIG. 3 is a perspective view of one embodiment of the component package cover 104, and a plurality of individual integrated circuit dies 112 and/or components mounted on the carrier 111 between a plurality of sidewalls 102 in position for assembly. The sidewalls 102 extend from the carrier 111 in a general crossing pattern to define a plurality of component packages 108 having a cavity 110 to receive components therein. In one aspect, the sidewalls 102 are generally aligned with each integrated circuit die 112 and/or component to allow, for example, the integrated circuit die 112 to fit between the sidewalls 102 and within the cavity 110. For example, as illustrated, the sidewalls 102 may be configured to fit between the plurality of integrated circuit dies 112 disposed adjacent the carrier 111. In one embodiment, an adhesive layer 114 of any conventional formulation such as epoxy, or glue, may be applied between the component package cover 104 and an upper surface of the sidewalls 102 distal the carrier 111 to bond the sidewalls 102 and the component package cover 104 together. The sidewalls 102 are arranged to form each component packages 108 in a generally rectangular shape, but may be arranged to form any desired shape such as square, quadrilateral, trapezoidal, and the like. For example, the sidewalls 102 may be more circular in shape to accommodate generally round integrated circuits and/or components. The component package cover 104, and the sidewalls 102 are formed of conventional materials such as polymers, ceramics, glass, and the like, adapted to provide components protection from external damage and contamination. It is contemplated that the component package cover 104 and/or sidewalls 102 may be molded, or formed, using techniques such as thermoplastic injection, molding, casting, and the like. In one aspect, the sidewalls 102 may be formed with an inverted bevel to allow the mold to be more easily removed after the sidewalls 102 are formed.

FIG. 4 is a top view illustration of one embodiment of a component package cover 104 assembled to a plurality of component packages 108 having a cavity 110 having a gas such as air therein proximate to and aligned with an associated integrated circuit die 112. When assembled, as illustrated in FIG. 4, the integrated circuit dies 112 are disposed within the cavities 110 to form a component package assembly 116 defining a plurality of individual component packages 118. Each individual component package 118 includes at least one component such as the integrated circuit die 112 disposed on a component mounting surface 117 of the carrier 111, and interconnected to external connection pads 120 on the carrier 111 via bonding pads 122 using interconnection wiring 126. For example, FIG. 5 illustrates a cut away view of one embodiment of the component package assembly 116 before separating into a plurality of individual component packages 118 including one integrated circuit die 112 connected to the bonding pads 122. In one aspect, to seal the frame 111 a filling material such as plastic, rubber, or other similar types of filling material is used to fill gaps between the bonding pads 122 and a component-mounting surface 117 to form a bottom portion 119 of the individual component packages 118. In one embodiment, the sidewalls 102 and the bottom portion 119 are formed together. For example, the sidewalls 102 and the bottom portion 119 may be molded to the carrier 111 during the component package formation as described below with reference to FIG. 7. The sidewalls 102, carrier 111, adhesive 114, and cover 104 are adapted to be separated by a cutting tool (not shown) such as a saw, laser, water cutting tool, milling tool, lath, and the like. The cutting tool is adapted to cut between the sidewalls 102, adhesive layer 114, carrier 111, and bottom portion 119, and component package cover 104 to separate the component package assembly 116 into the individual component packages 118. In one aspect, the height of the component package cover 104 relative to the carrier 111 is adjusted to allow the internal wiring 126 sufficient space to be mounted to the integrated circuit die 112 using conventional wiring techniques. In another aspect, the internal surfaces of the sidewalls 102 and the component package cover 104 include a metallization layer 103 thereon to provide internal and/or external shielding from electromagnetic radiation. In one aspect, the metallization layer 103 may be applied to the cover before assembly using coating techniques such as painting, sputtering, and other techniques used to apply metallization coatings. FIG. 6 is a perspective view in partial cross section illustrating an individual integrated circuit package 118 after separation from the component package assembly 116 of FIG. 4.

Figure 7:
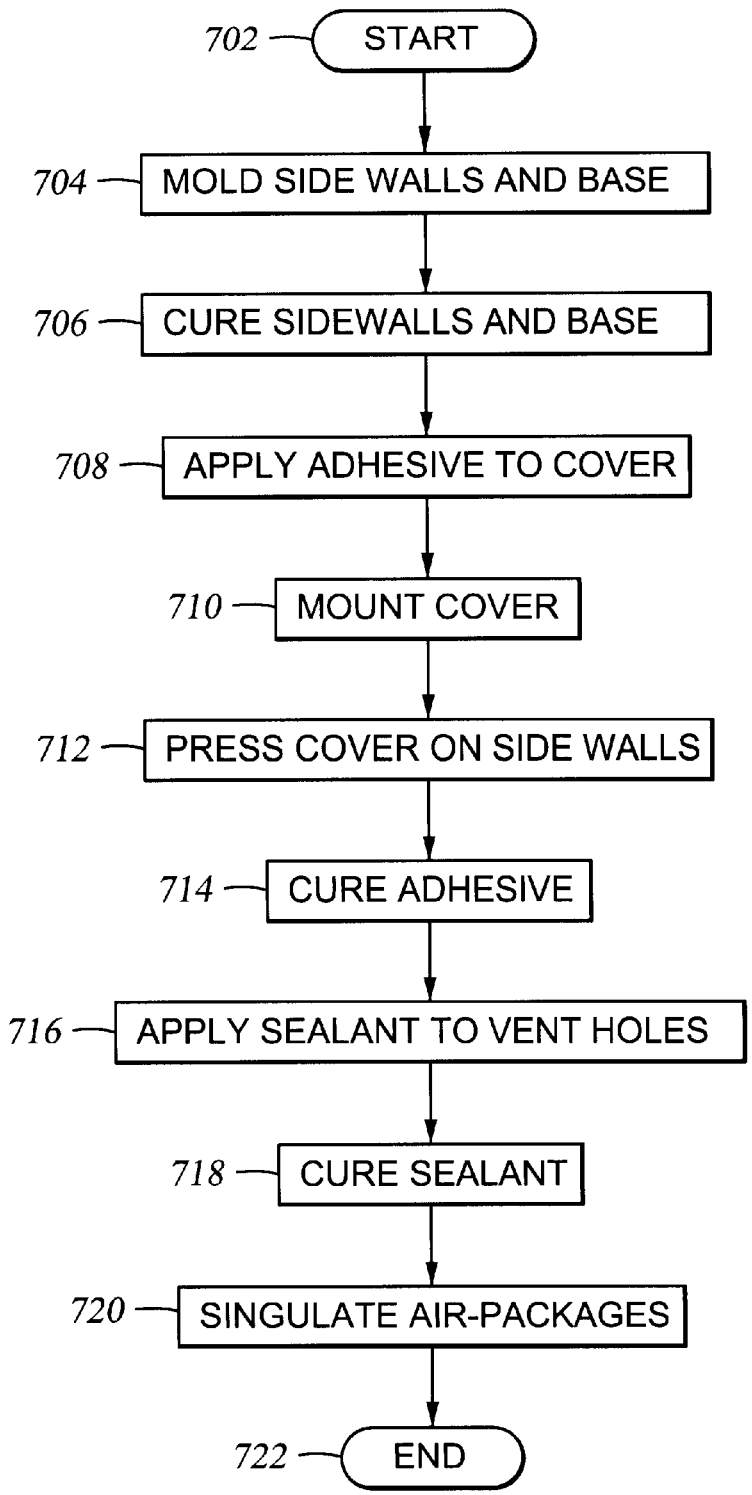
FIG. 7 is a flow diagram of a process of forming component packages.

FIG. 7 is a flow diagram of a method 700 of forming individual component packages 118. As necessary, FIGS. 1–6 are referenced in the following discussion of FIG. 7.

FIG. 7 is entered at step 702 when for example an assembly step for forming individual component packages 118 is initiated. At step 704, the method 700 uses process such as injection molding, screen-printing, stenciling, and other similar techniques, adapted to form the sidewalls 102 and the bottom 119, thus, forming the component packages 108 and cavities 110. The sidewalls 102 and bottom portion 119 are then cured at step 706. While in one aspect the components may be installed onto the component-mounting surface 117 before assembling the component package cover 104, it is contemplated that the components may also be assembled to the carrier 111 prior to the formation of the sidewalls and bottom 119 at step 704. At step 708, the method 700 applies an adhesive layer 114 between the component package cover 104 and the sidewalls 102. In one aspect, the adhesive layer 114 may formed as a separate sub-assembly and then disposed on the component package cover 104. For example, the adhesive layer 114 may be formed from an adhesive material. One embodiment of the adhesive layer 114 is illustrated with respect to FIG. 3. The component package cover 104 is then aligned with the carrier 111 and sidewalls 102 and then is mounted to the component package cover 104 at step 710. At step 712, the method 700 presses a flattening tool (not shown) to place about an equal pressure between the component package cover 104 and sidewalls 102. At step 714, the method 700 cures the adhesive using curing techniques such as heating, air curing, and/or other similar curing processes. In one aspect, the vent holes 105 are sealed using a sealant such as a rubber, or plastic, to prevent contamination from entering the cavity 110 at step 716. The sealant is cured at step 718 using curing techniques such as heating, air curing, and/or other similar curing processes. At step 720, the component package assembly 116 is separated into independent integrated circuit packages 118. While In one embodiment, the assembly process is performed by conventional assembly tools used to package integrated circuits such as an integrated circuit packing apparatus (not shown), or pick and place robotic tool, it is contemplated that the assembly may be performed by other means such as by hand, or by one or more conventional assembly tools used to package integrated circuits and/or components.

Although various embodiments which incorporate the teachings of the invention have been shown and described in detail herein, those skilled in the art can readily devise many other varied embodiments within the scope of the invention. For example, in one embodiment, the sidewalls 102 may be laid out in a variety of different patterns to accommodate different sizes of components. For example, the pattern of the sidewalls 102 may form a plurality of different package sizes to accommodate a variety of different sized components disposed on the same carrier 111.

In summary, aspects of the invention provide a method 700 of packaging at least one component (e.g., integrated circuit die 112), comprising forming 704 a component package assembly 116 including a plurality of component packages 118 on a carrier 111 where each of the plurality of component packages 118 includes a cavity 110 to receive the at least one component therein, and then separating 720 the component packages into a plurality of individually packaged components 118. In one aspect, the component comprises one or more of an integrated circuit die 112, resistors, capacitors, inductors, and combinations thereof. In another aspect, the component package assembly 116 is formed of materials comprising polymers, ceramic, glass, and combinations thereof. In another aspect, forming 704 the component package assembly 116 comprises forming 704 sidewalls 102 on the carrier 111 to define the plurality of component packages 118 where forming 704 the sidewalls 102 on the carrier 111 comprises molding the sidewalls 102 on the carrier 111 and/or where forming 704 sidewalls on the carrier 111 comprises stenciling the sidewalls on the carrier 111. In another aspect, forming 704 the component package assembly 116 comprises bonding 708 a cover 104 to the sidewalls 104 distal the carrier 111 bonding 708 the cover 104 to the sidewalls 102 comprises applying 708 adhesive 114 between the cover 104 and the sidewalls 102 to form an adhesive bond therebetween. In another aspect, separating the component packages 116 into a plurality of individually packaged components 118 comprises cutting 720 between the component packages 118 where cutting comprises sawing, laser cutting, water cutting, milling, machining, lathing, and combinations thereof.

In another embodiment, aspects of the invention provide a method 700 of packaging at least one component (e.g., the integrated circuit die 112), comprising forming 704 a body 116 including a plurality of separable component packages 118 on a carrier 111, and then forming 704 a cavity 110 within each of the component packages 118 to enclose the at least one component disposed on the carrier 111 therein. In one aspect, forming 704 the body 116 comprises forming 704 sidewalls 102 defining the component packages 118. In another aspect, forming 704 the cavity 110 within each of the component packages 118 comprises bonding a cover 104 to the sidewalls 108 distal the carrier 111. In one aspect, the method 700 includes separating 720 the body 116 to form individual component packages 118 where separating 720 comprises sawing the body 116 with a saw, laser cutting tool, water cutting tool, mill, lath, and combinations thereof. In another aspect, forming 704 the cavity 110 within each of the component packages 118 to enclose the at least one component disposed on the carrier 111 therein, comprises forming 704 sidewalls and a bottom portion 119 on the carrier 111 where in addition, the method 700 includes bonding 710 a cover 104 to the sidewalls 102 that exceeds the height of the at least one component.

In another embodiment, aspects of the invention provide a package 118 for enclosing at least one component, comprising a component package assembly 116 including a plurality of separable sidewalls 102 formed on a carrier 111 where the separable sidewalls 102 and carrier 111 define a plurality of separable component packages 108 adapted to enclose the at least one component therein. In one aspect, the component package assembly 116 includes a cover 111 wherein the separable sidewalls 102, carrier 111, and cover 104 define a cavity 110 within each of the plurality of component packages 108. In another aspect, when the component package assembly 116 is separated, the plurality of component packages 108 define a plurality of individually packaged components 118.

While the foregoing is directed to the preferred embodiment of the invention, other and further embodiments of the invention may be devised without departing from the basic scope thereof, and the scope thereof is determined by the claims that follow.

What is claimed is:

1. A method of packaging at least one component, comprising:
    forming a component package including a plurality of component packages on a lead frame carrier wherein each of the plurality of component packages includes a cavity to receive the at least one component therein;
    mounting a component on the lead frame carrier in the cavity of each component package;
    applying a curable adhesive between said component packages and a top cover that spans all said component packages, said top cover including at least one vent hole corresponding to each cavity;
    curing said adhesive, said vent hole providing for the escape of water and other gasses that may off-gas during the curing process;
    sealing said vent holes with a curable material;
    curing said sealing material; and
    separating the component packages into a plurality of individually packaged components.

2. The method of claim 1, wherein the component comprises one or more of an integrated circuit die, resistors, capacitors, inductors, and combinations thereof.

3. The method of claim 1, wherein the component package assembly is formed of polymers.

4. The method of claim 1, wherein forming the component package assembly comprises forming sidewalls on the lead frame carrier to define the plurality of component packages.

5. The method of claim 4, wherein forming the sidewalls on the carrier comprises molding the sidewalls on the lead frame carrier.

6. The method of claim 1, wherein curing said adhesive comprises heating it.

7. The method of claim 4, wherein forming the component package assembly comprises bonding a cover to the sidewalls distal the carrier.

8. The method of claim 4, wherein bonding the top cover to the sidewalls comprises applying adhesive between the cover and the sidewalls.

9. The method of claim 1, wherein separating the component packages into a plurality of individually packaged components comprises cutting between the component packages.

10. The method of claim 9, wherein cutting comprises sawing, laser cutting, water cutting, milling, machining, lathing, and combinations thereof.

11. The method of claim 1, wherein molding the component packages comprises molding sidewalls and a bottom portion on the lead frame carrier.

12. The method of claim 11, further comprising bonding a top cover to the sidewalls that exceeds the height of the at least one component.

* * * * *